(12) United States Patent
Kitatani et al.

(10) Patent No.: US 7,636,378 B2
(45) Date of Patent: Dec. 22, 2009

(54) SEMICONDUCTOR LASER DIODE

(75) Inventors: Takeshi Kitatani, Hino (JP); Kazunori Shinoda, Musashino (JP); Koichiro Adachi, Musashino (JP); Masahiro Aoki, Kokubunji (JP)

(73) Assignee: Opnext Japan, Inc., Kanagawa (JP)

( * ) Notice: Subject to any disclaimer, the term of this patent is extended or adjusted under 35 U.S.C. 154(b) by 0 days.

(21) Appl. No.: 12/028,127

(22) Filed: Feb. 8, 2008

(65) Prior Publication Data

US 2009/0129421 A1     May 21, 2009

(30) Foreign Application Priority Data

Nov. 21, 2007   (JP)   ............... 2007-301662

(51) Int. Cl.
*H01S 5/00*   (2006.01)
(52) U.S. Cl. ................. 372/50.1; 372/50.23; 372/43.01
(58) Field of Classification Search ................ 372/50.1, 372/50.23
See application file for complete search history.

(56) References Cited

U.S. PATENT DOCUMENTS

| 2003/0007535 A1* | 1/2003 | Haase et al. .................. 372/50 |
| 2007/0019698 A1* | 1/2007 | Fukuhisa et al. ....... 372/50.121 |

FOREIGN PATENT DOCUMENTS

| JP | 2003-110195 | 4/2003 |
| JP | 2004-235182 | 8/2004 |
| JP | 2007-005594 | 1/2007 |

\* cited by examiner

*Primary Examiner*—Dung T Nguyen
(74) *Attorney, Agent, or Firm*—Antonelli, Terry, Stout & Kraus, LLP.

(57) ABSTRACT

In an edge emitting laser having a window region with a ridge-waveguide structure, particularly, in a short cavity type of a laser operated with a low current, there has been a problem of its operating current being increased due to current leakage of the window portion. To solve this problem, in the window region, between an n-type substrate and a p-type cladding layer, a semi-insulating semiconductor layer into which Ru is doped is inserted. Alternatively, a stacked structure of a Ru-doped layer and a Fe-doped layer is introduced.

18 Claims, 9 Drawing Sheets

RIDGE-WAVEGUIDE STRUCTURE
(CROSS-SECTIONAL VIEW
PERPENDICULAR TO THE
MESA STRIPE DIRECTION)

RIDGE-WAVEGUIDE STRUCTURE
(CROSS-SECTIONAL VIEW
PARALLEL TO THE
MESA STRIPE DIRECTION)

BURIEDHETERO STRUCTURE
(CROSS-SECTIONAL VIEW
PERPENDICULAR TO THE
MESA STRIPE DIRECTION)

BURIEDHETERO STRUCTURE
(CROSS-SECTIONAL VIEW
PARALLEL TO THE
MESA STRIPE DIRECTION)

SEMICONDUCTOR LASER DIODE

CLAIM OF PRIORITY

The present application claims priority from Japanese application JP 2007-301662, filed on Nov. 21, 2007, the content of which is hereby incorporated by reference into this application.

BACKGROUND OF THE INVENTION

1. Field of the Invention

The present invention relates to semiconductor laser diodes. More particularly, it relates to semiconductor laser with a ridge-waveguide structure and an electro-absorption modulator integrated DFB laser carrying the same.

2. Description of the Related Art

Recently, the demands for greater transmission capacities and increase in transmission speed are rapidly growing with the explosive increase in the Internet users, and it is considered that optical communications will play an important role in the future, too. Semiconductor lasers are widely used as light sources for optical communication systems. With the spread of optical communications, not only increase in modulation speed but also reduction in power consumption and reduced costs are strongly required. Various type of semiconductor lasers having different emission wavelengths are used for suitable applications, especially for suitable transmission distances. For short-reach applications whose transmission distance is 10 km or less, a directly modulated semiconductor laser with 1.3 μm wavelength band is mainly used.

In the case of the directly modulated lasers, because a optical module is realizable with a simple constitution, its power consumption is small. Since the number of parts consisting of the module can be reduced, reduction in cost is also possible. The transmission speed of such optical modules in practical use is now becoming 10 Gb/s. As directly modulated semiconductor lasers, there are a vertical-cavity surface-emitting laser (VCSEL) and an edge-emitting laser (EEL) Owing to a cavity length of several μm, VCSEL operates with an operation current of about several to ten mA, and, thus, its power consumption is small. Further, a laser beam is emitted at vertical direction to a substrate. So, the sorting of laser chip is possible in the state of wafers before cleaving process. Thus, VCSEL is also good for cost reduction. However, when using a VCSEL with 1.3 μm wavelength band which is suitable for a standard single-mode fiber, in case of the transmission distance of several km, optical output power of several mW required for transmission cannot easily be obtained. This is due to small aperture region of about 5 μm in VCSEL to emit a single-mode laser beam.

The cavity length of the conventional EEL is limited to about 200 μm. Therefore, for the high-speed operation of 10 or more Gbits/s, typical drive current is about 60 mA or more. As a result, in case of conventional EEL, it is difficult to further reduction in the power consumption. Therefore, as a new directly modulated type light source taking its place, a short cavity type of a laser described in Patent document 1 (JP-A No. 2007-5594) is proposed. In order to achieve both the low-current operation, which is the key to a low power consumption, and the optical output of several mW necessary for transmission distance of several km, the length of an active layer region is shortened. Further, the cavity length of a laser is set to a value within a range of from 10 to 100 μm which is an intermediate value of those of the conventional VCSEL and EEL. Thus, assuming that the upper limit of a drive current is set to about 80 mA, it is shown by calculation that a maximum value of the relaxation oscillation frequency is obtained under such cavity-length conditions. At the same time, there are also proposed an cost-effective structure which has slant reflecting mirror for converting the direction of a laser beam to be that of the surface emitting type and which has a lens for focusing the laser beam.

FIG. 1 shows a bird's eye view of a short cavity type of a laser. The laser structure is of a distributed Bragg reflector (DBR) type. FIG. 2 shows a cross-sectional structure of the short cavity type of a laser. Numeral 101 and 201 are lower electrodes; 102 and 202 are n-InP substrates; 103 and 203 are HR coating films; 104 and 204 are active layers; 105 and 205 are p-InP cladding layers; 106 and 206 are contact layers; 107 and 207 are upper electrodes; 108 and 208 are diffraction gratings; 109 and 209 are InGaAsP layers of a DBR region; 110 and 210 are slant reflectors; and 111 and 211 are back-surface lenses. Here, lengths of the active layers 104 and 204 are set to values within a range of from 10 μm to 100 μm. A distributed-feedback (DFB) type may also be applied to the present laser. In that case, the diffraction grating is formed above or under the active layer, and InP layers are often used instead of the InGaAsP layers 109 and 209 of the DBR region. This InP layer may also be formed at the same time that the p-InP cladding layer is formed. In such a case, pn junction of InP is may formed. At this time, as described in Patent document 2 (JP-A No. 2004-235182), it is preferable to form a reflecting mirror composed of semiconductor layers having two kinds of different refractive indices under the active layer.

With respect to structures of semiconductor laser diodes, there are roughly two kinds, that is, a ridge waveguide (RWG) structure and a buried-hetero (BH) structure. This is the same for the previously described short cavity type of a laser. FIGS. 3A and 3B show a cross-sectional view perpendicular to the mesa stripe direction and a cross-sectional view parallel to the mesa stripe direction of the RWG structure and the BH structure of the DBR-type lasers, respectively. In FIG. 3A, numeral 301 is an n-InP substrate; 302 is an active layer; 303 is a p-InP cladding layer; 304 is a contact layer; 305 is a diffraction grating; 306 is an InGaAsP layer in a DBR region; 307 is a slant reflector; and 308 is a back-surface lens. Further, in FIG. 3B, numeral 309 is an n-type InP substrate; 310 is an active layer; 311 is a p-InP cladding layer; 312 is a contact layer; 313 is a diffraction grating; 314 is an InGaAsP layer in the DBR region; 315 is a slant reflector; 316 is a semi-insulating InP buried layer; and 317 is a back-surface lens In this case, for the simplicity of the explanation, electrodes and HR coating films are not illustrated. Also, a region including the portion of the slant reflector at the edge of the active layer is generally called a window region. In the conventional EEL, a window region is sometimes formed to suppress the interference between the optical feedback reflected at a cleaved facet and a laser beam.

In the RWG structure shown in FIG. 3A, when forming a mesa structure having a width of several μm by etching the upper cladding layer 305, etching is stopped above the active layer 302. Since the active layer portion is not etched, excessive damage to the active layer is not caused, which is advantageous in terms of highly reliable operation of the laser. On the other hand, in the BH structure shown in FIG. 3B, when forming a mesa, etching is performed deeply enough to a portion below the active layer 310. Further, a high-insulating semiconductor layer 316 is again buried in both sides of the mesa including the active layer. Therefore, sides of the active layer may be damaged during mesa etching, and its quality may be degraded. Particularly, in the active layers including an InGaAlAs material for 1.3 μm wavelength band containing high-content Al atoms, a chemically robust oxides is formed at the side of the active layer after the mesa etching process. As a result, a better buried hetero epitaxial growth is disturbed. Therefore, in order to overcome this difficulty, a special treatment for the side of the active layer is often necessary just before a crystal growth, and, thus, it is not easy to realize highly reliable operation of the laser.

Further, as described earlier, when integrating slant reflectors in the window region, in order to increase its reflective efficiency of the laser beam and allow the laser beams to focus on the lens effectively, a precise control of the etching angle of the slant reflector is indispensable. Since the slant reflectors are formed by dry etching or wet etching, when considering the controllability of the etching angle, it is preferred that a surface of the window region before etching should be flat. When comparing the RWG structure with the BH structure from this point of view, the surface of the window region of RWG structure in which the p-InP cladding layer 303 is re-grown on a surface where the active layer 302 and the InGaAsP layer 306 are smoothly joined in lateral direction, is more flatter than that of the BH structure in which the semi-insulating InP buried layer 316 is re-grown on a surface with a large thickness difference of more than 2 μm formed by mesa etching. It is preferred that the surface is flat in terms of manufacturing an laser with a high yield in the manufacturing process to be followed. Therefore, for the short cavity type of a laser, when comparing the RWG structure with the BH structure in terms of reliable operation and surface flatness, it is understood that the RWG structure is more advantageous than the BH structure.

SUMMARY OF THE INVENTION

Now, problems of the EEL having a window region with a RWG structure, particularly, of the short cavity type of a laser will be described. In order to operate a laser, it is necessary to apply a voltage of a forward direction between a p-InP cladding layer and an n-InP substrate through an electrode, and to inject an electric current into the active layer 302. The applied voltage usually spreads over an area larger than an electrode portion by several μm. Therefore, in the RWG structure of the DBR-type laser in FIG. 3A, in the window region, a forward voltage is unintentionally applied to the portion near the active layer of the InGaAsP layer 306. Since the intentional doping is not given to the InGaAsP layer 306, as a typical value, the background carrier concentration of the InGaAsP layer is about $5 \times 10^{14}$ cm$^{-3}$ in the n-type, and, thus, the resistivity of the layer is about 1 Ωcm. Therefore, the some current flows through a part of the InGaAsP layer when the laser is operated. This leak current, which is not injected into the active layer, degrades laser characteristics. Moreover, in the DFB-type laser described earlier, the window region is the pn junction of InP, and the leak current becomes larger. On the other hand, in the BH structure of the FIG. 3B(b), the semi-insulating InP buried layer 316 (whose resistivity is more than $5 \times 10^7$ Ωcm) is formed in the window region with a thickness of about several μm. Therefore, the leak current is suppressed. Moreover, in the RWG structure, a surface current flows in the pn junction on the surface of the slant reflector. In particular, this current tent to increase when certain substances adheres to the surface or when the surface is covered with an insulating film. This also increases a leak current and degrades laser characteristics. As the cavity length becomes shorter, a threshold current becomes lower and the proportion of the leak current component to an operating current becomes higher. Therefore, the leak current serious influences laser characteristics, especially for the short cavity type of a laser. As a result, it disturbs the operation at a low drive current.

Further, additional reason for the increase of leak current is due to the increase of the resistance of laser with decrease of the cavity length. Patent document 3 (JP-A No. 2003-110195) is reported on the problem of the leak current of the conventional EEL which has a window region. In order to suppress the leak current in the window region, the Fe doped semi-insulating layer with the same thickness as that of the active layer is inserted. InP, InGaAsP and others are disclosed as Fe-doped semi-insulating layers. By doping Fe using a well-known technology, the resistivity of the InP single layer to be inserted, for example, can be increased to about $5 \times 10^7$ Ωcm. However, when stacking with a p-doping layer and Fe-doped semi-insulating layer is actually considered, the situation is quite different. It is known that Fe causes inter diffusion with Zn which is generally used as p-type dopant in the metal-organic vapor phase epitaxy (MOVPE) method. For example, in Applied Physics Letters, vol. 67, 1995, pp. 479-481, FIG. 2(b), the result of the secondary ion mass spectrometry when a Zn doped InP layer is stacked on the Fe doped InP layer is shown. According to FIG. 2(b), it is seen that Zn atoms are diffused into the Fe doped InP layer, and Fe atoms are diffused into the Zn doped layer. At the interface between the Fe doped InP layer and the Zn doped InP layer, the Fe atoms are depleted at around 300 nm near the Fe doped layer side. Further, Zn atoms (with resistivity of about 1 Ωcm) of about $5 \times 10^{16}$ cm$^{-3}$ is diffused there. Therefore, it is conceivable that considerable decrease in the resistivity at the stack interface takes place as a result. Generally, since the thickness of the active layer 302 of a laser is 300 nm or less, the thickness of the Fe-doping layer to be inserted is almost the same. Moreover, even if the thickness of the Fe-doping layer is set to be thicker than that of the active layer, the thickness near the junction with the Fe-doping layer and the active layer 302 does not change. As a result, even if the Fe doping is applied to the InGaAsP layer or the InP layer of the window region by the conventional technology, it is not possible to suppress the leak current completely.

FIG. 4 shows the estimation of the leak current as a function of the resistivity of the semiconductor layer to be inserted in the window region. In FIG. 4, the thickness of the layer to be inserted in the window region is set to be 0.3 μm, which is almost the same as that of the active layer. The leak area is assumed to be 2 μm in width and extends 1 μm from the edge of the active layer. Also, the applied voltage is also assumed to be 1V. When the resistivity is 1·cm which is equivalent to the resistivity of the undoped layer described earlier or resistivity of the Fe-doping layer after the Zn diffusion, the leak current was estimated to be about 0.7 mA. Compared to the threshold current of about 10 mA of the conventional laser whose cavity length is 200 μm, this value is not so large. However, when compared with the threshold of several mA for the short cavity type of a laser referred to in the present invention, 0.7 mA is a high value exceeding by 10% of its threshold current. Although the result shown in FIG. 4 is simply one of the various operating conditions of the laser, the general tendency is almost the same. Therefore, it can be said that it is difficult to completely suppress the leak current in the window region by using the conventional technology.

In view of the above, the present invention is to solve the problem of suppressing the leak current in the window region, which has considerable influence on EEL with a RWG structure having a window region and, in particular, on a short cavity type of a laser with a low operating current.

In order to solve the above problem, the present inventors devised following two novel laser structures. A first structure of the present invention is an RWG-type semiconductor laser which includes, on a semiconductor substrate, an active layer for generating light, upper and lower cladding layers for confining the generated light, and a cavity structure in a direction parallel to the substrate, and has a mesa structure formed above the active layer. The semiconductor laser structure has a window region composed of a semiconductor layer whose band gap is larger than the energy of the laser beam. The window region is composed of a stacked structure of an n-type semiconductor layer, a semi-insulating semiconductor layer, and a p-type semiconductor layer. In the semiconductor layer structure, a layer into which a material selected from the group of Ru, Os, Rh, and Ti is doped is used for part of or whole of the semi-insulating semiconductor layer. FIG. 5 shows its specific example. The laser is the DBR type. In addition, the semiconductor material used for the semiconductor laser is made of combinations of elements selected from the group of In, Ga, Al, B, Tl, Bi, As, P, Sb, and N. In FIG. 5, numeral 501 is a lower electrode; 502 is an n-InP substrate, 503 is an HR coating film; 504 is an active layer; 505 is a p-InP cladding layer; 506 is a contact layer; 507 is an upper electrode; 508 is a diffraction grating; 509 is a Ru-doped InGaAsP layer; 510 is a slant reflector; and 511 is a back-surface lens. According to the proceedings of the international conference on indium phosphorus and related materials, 1998, TuA2-p357, A. Dadgar et al., the result of the secondary ion mass spectrometry when a Zn-doped InP layer is stacked on an Ru-doped InP layer is shown. According to the report, when Ru is used for dopant, an InP film can be formed into a high resistivity like Fe, however it is shown that, differing from Fe, the interdiffusion with Zn does not take place. As a result, doping concentration of Ru can also be made high compared with Fe. Therefore, the resistivity of a Ru dopded semiconductor layer can also be raised to about $1 \times 10^5$ Ωcm level, which is higher than that of Fe by one order magnitude, and the resistivity does not fall by stacking with the Zn doped p-InP layer. Therefore, the leak current at the edge of the active layer 504 and the surface of the slant reflector can be suppressed by giving Ru doping to the InP layer of the window region and the InGaAsP layer sandwiched by the n-InP substrate and the p-InP cladding layer. As a result, it becomes possible to manufacture the short cavity type of laser with the RWG-waveguide structure which operates at a low current. Besides Ru, as doping atoms, which have no interdiffusion with Zn and are capable of allowing the InP etc. to be higher resistors, there are Os, Rh, Ti, etc. available, and it is possible to obtain similar effects by using them.

A second structure of the present invention is an RWG-type semiconductor laser which includes, on a semiconductor substrate, an active layer which generates light, a cladding layer adapted to confine the generated light, and a cavity structure in a direction parallel to the substrate, and a mesa structure is formed above the active layer. The second laser structure has a window region composed of a semiconductor layer with a band gap larger than the energy of a laser beam. The window region is composed of a stacked structure of an n-type semiconductor layer, a semi-insulating semiconductor layer, and a p-type semiconductor layer. Part of or whole of the semi-insulating semiconductor layer has a stacked structure of a layer into which a material selected from the group of Ru, Os, Rh, and Ti is doped and a layer into which Fe is doped. The layer into which Fe is doped is stacked continuously with the p-type semiconductor layer into which Zn is doped. FIG. 6A shows its specific example. The element used was of the DFB type. In FIG. 6A, numeral 601 is a lower electrode; 602 is an n-InP substrate; 603 is an HR coating film; 604 is an active layer; 605 is a diffraction grating; 606 is a contact layer; 607 is an upper electrode; 608 is a p-InP cladding layer; 609 is an Fe-doped InP layer; 610 is an Ru-doped InP layer; 611 is a slant reflector; 612 is an n-InP buffer layer; 613 is a multilayer reflecting mirror; and 614 is a back-surface lens.

This is a structure for further enhancing the suppression effect of the leak current in the first element structure described earlier. Specifically, the InP layer of the window region sandwiched by the n-InP substrate and the p-InP cladding layer is formed as a stacked structure of the Ru-doping layer and the Fe-doping layer. In this regard, the Fe-doped InP is positioned next to the p-InP cladding layer. As stated earlier, an Fe atom has a property of having interdiffusion with Zn which is p-type dopant. Conversely interpreted, the Fe atoms are diffused in the Zn-doping layer and are effective in reducing effectual p-type doping concentration. With the structure shown in FIG. 6A, in the A region, Fe is spread from an Fe-doping layer into the p-InP layer, and Zn is conversely spread into the Fe-doping layer from the Zn-doping layer. Since the effectual p-type concentration of the p-type layer falls, its resistivity increases. This brings about the effect of reducing the leak current. Therefore, the leak current suppression effect can further be raised as compared with the first laser structure by a synergistic effect with the high resistive lower layer into which Ru is doped.

According to the result shown in FIG. 4, by applying the layer (resistivity: about $1 \times 10^9$ Ωcm) into which Ru is doped, it is seen that the leak current can be reduced to a very small value (in this result, about $1 \times 10^{-9}$ mA).

By using the structure of the present invention described above, it is possible to suppress the leak current in the EEL having a conventional window region with a RWG structure, particularly, in the short cavity type of a laser, and to realize the operation at a low current.

Further, the present invention is similarly applicable to other optical devices (for example, an electro-absorption modulator integrated DFB laser) having a window region. In a modulator, unlike a laser, the reverse bias voltage is applied. In this case, by applying the invention, generated photo carriers can effectively be guided to an electrode, which has an effect of suppressing the pile up of the photo carries.

In a EEL with a RWG structure, particularly, in a short cavity type of a laser, in order to suppress the increase in the operating current caused by the current leak at the window region, a semiconductor layer of a semi-insulation property into which Ru is doped is inserted between the n-type substrate and the p-type cladding layer. Or the stacked structure of a layer into which Ru is doped and an Fe-doping layer is introduced Accordingly, the leak current can be suppressed and the low-current operation as designed can be realized.

DESCRIPTION OF THE PREFERRED EMBODIMENTS

Examples of the present invention will be explained with reference to FIG. 5, FIGS. 6A and 6B, and FIG. 7 and FIG. 8.

EXAMPLE 1

Example 1 is a case where an Ru-doping layer alone is used to suppress a leak current in the window region. The laser is of a DBR type. The MOVPE method was used as a growth method. As source materials of group-III elements, triethyl gallium (TEG), trimethyl indium (TMI), and trimethyl aluminum (TMA) were used. As source materials of group-V elements, arsine ($AsH_3$) and the phosphine ($PH_3$) were used. Moreover, disilane ($Si_2H_6$) was used as n-type dopant, and dimethyl zinc (DMZ) was used as p-type dopant. Furthermore, as an Ru source material, bis ($\eta$ 5-2,4-dimethylepentadienyle ruthenium(II)) was used. However, materials are not limited to the above as long as they contain Ru. In addition, growth methods are not limited to the MOVPE method. For example, a molecular beam epitaxy (MBE) method, a chemical beam epitaxy (CBE) method, and a metal-organic molecular beam epitaxy (MOMBE) method, etc. can be used.

Figure 1:
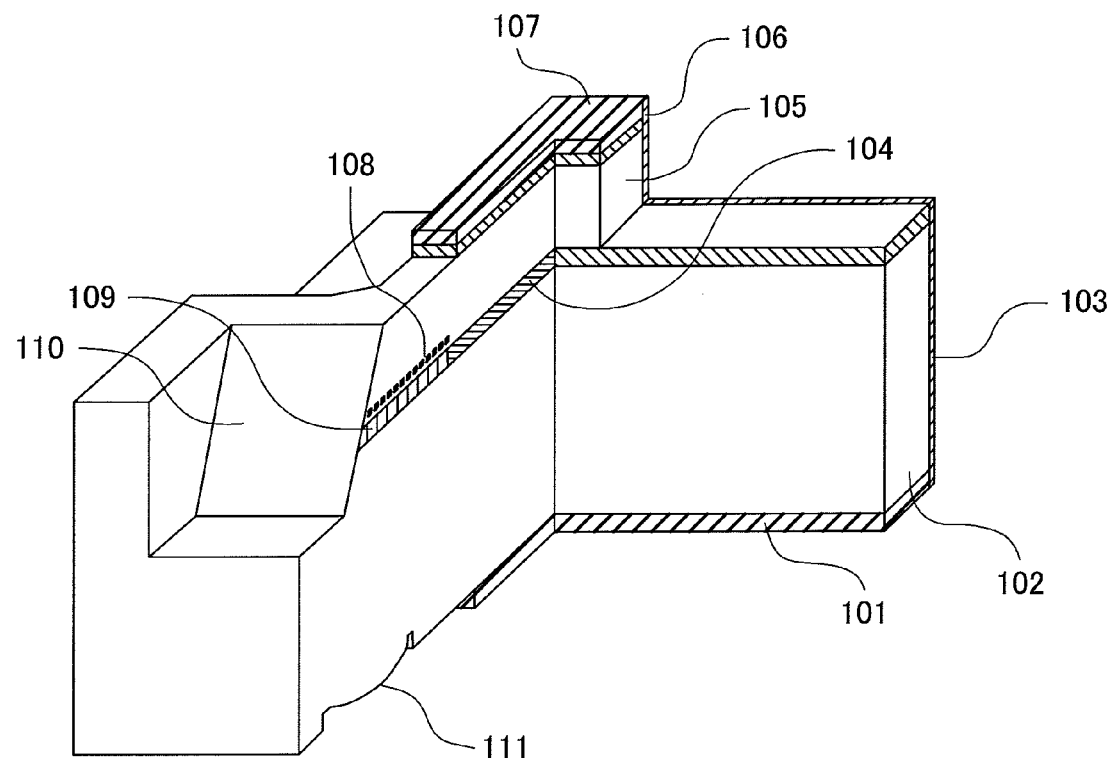
FIG. 1 is a bird's eye view of a conventional short cavity laser.
Figure 2:
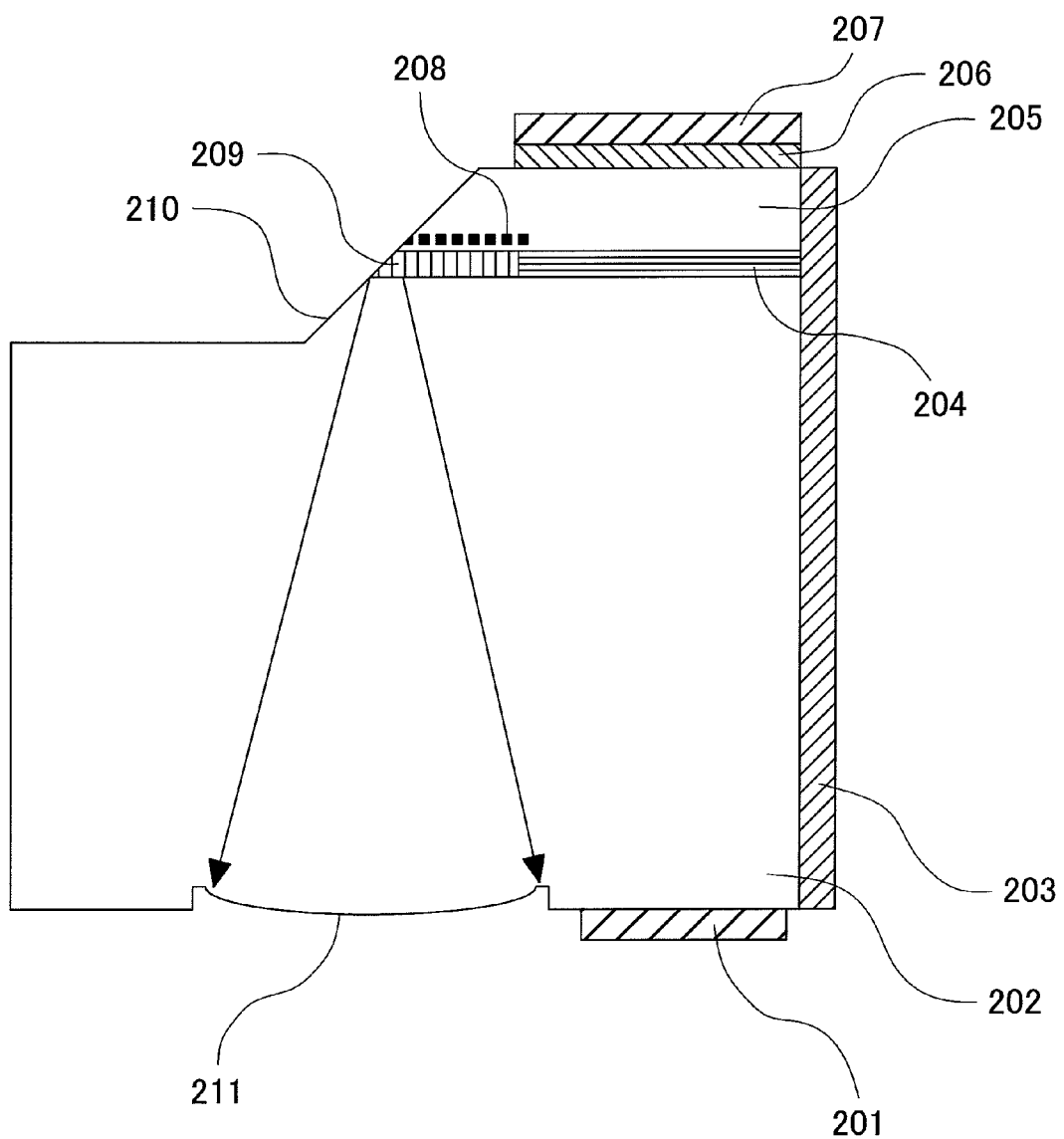
FIG. 2 shows a cross-sectional view of the conventional short cavity laser.
Figure 3A:
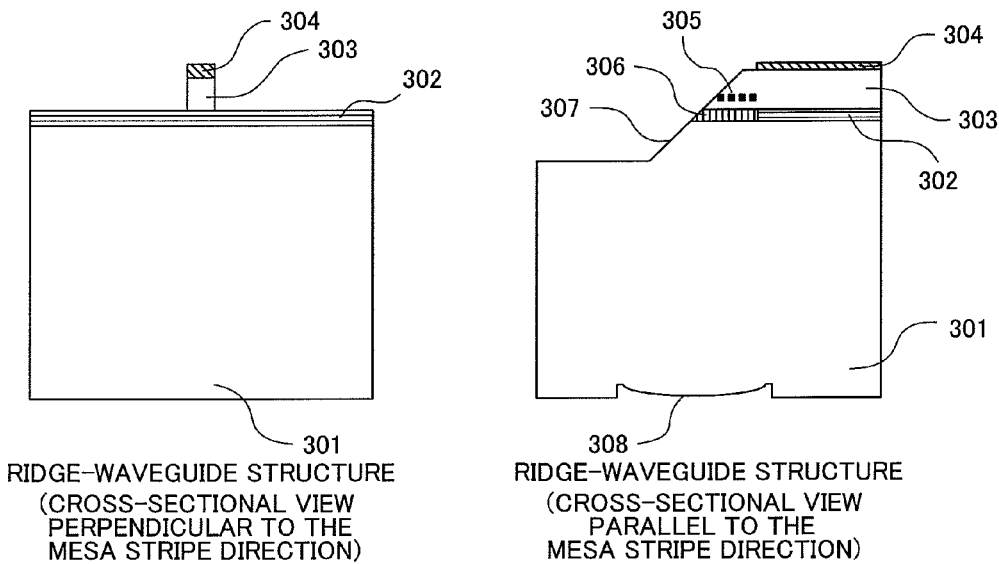
FIG. 3A shows an RWG structure of the conventional short cavity laser.
Figure 3B:
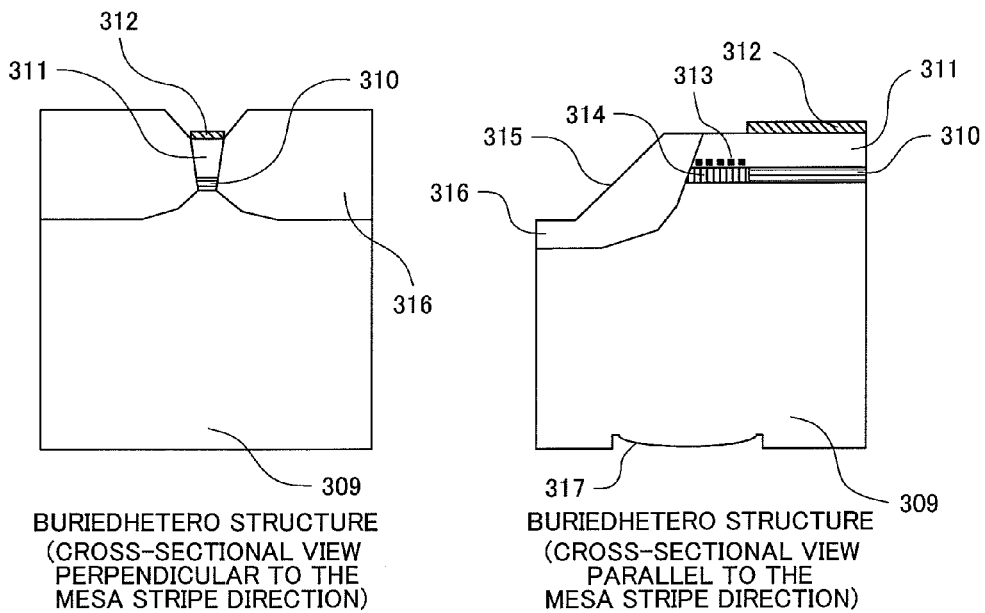
FIG. 3B shows an BH structure of the conventional short cavity laser.
Figure 4:
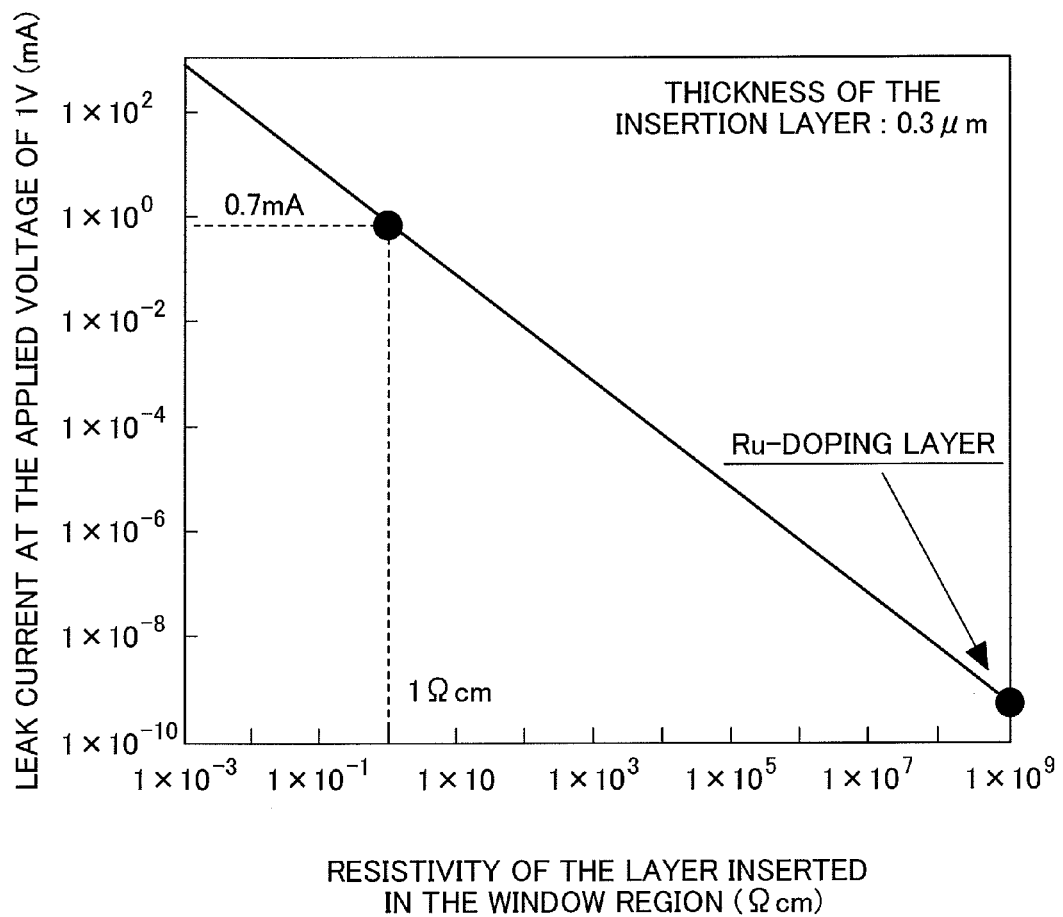
FIG. 4 shows the relationship between the resistivity of a film to be inserted in a window region and a leak current.
Figure 5:
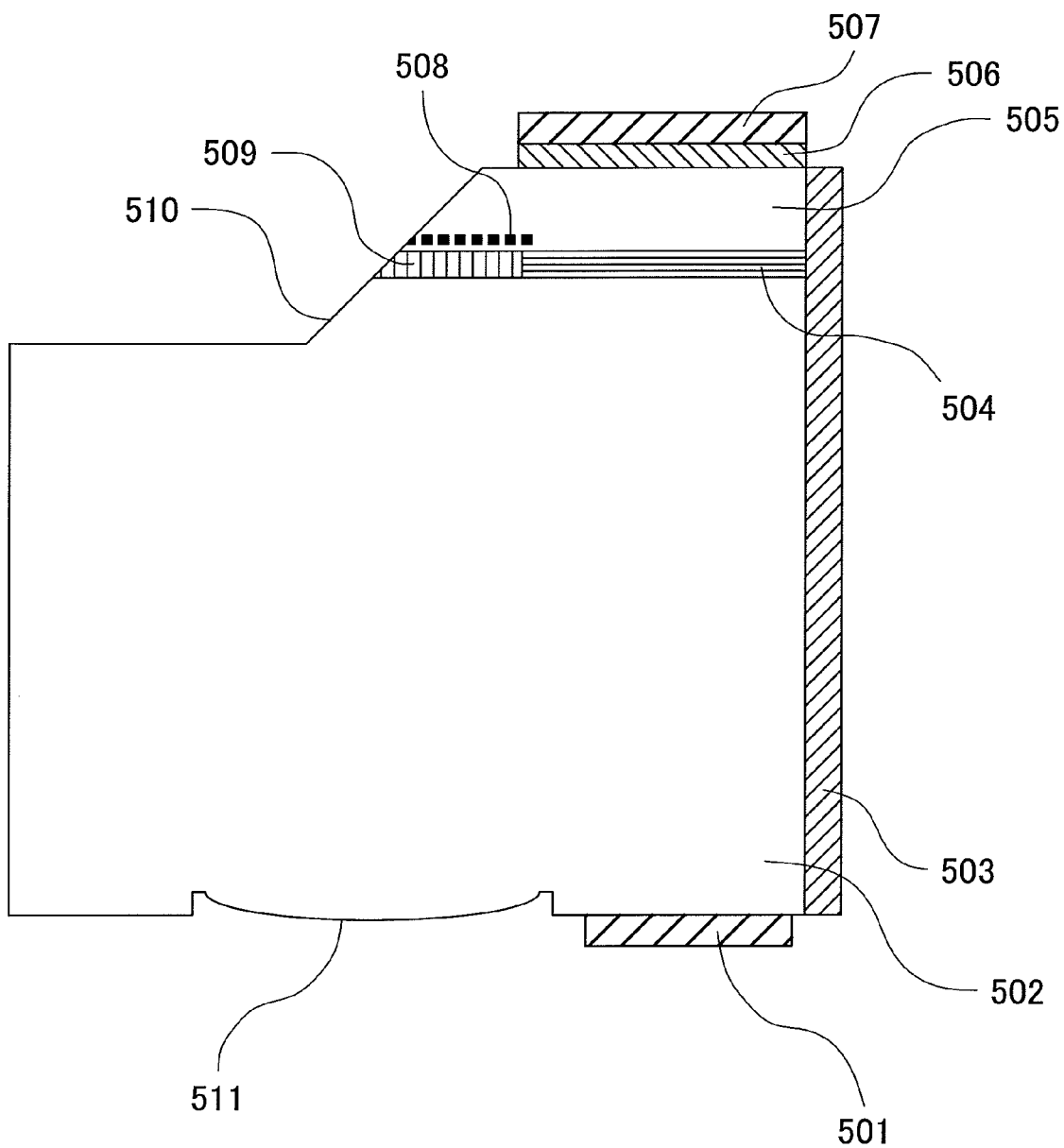
FIG. 5 shows a cross-sectional view of an InGaAlAs short cavity laser of the present invention.

FIG. 5 is a cross-sectional view of the laser. First, a laser part multiple-quantum-well (MQW) active layer 504 made of InGaAlAs is grown on an n-InP substrate 502. Next, a mask of a desired shape was formed. After removing an unnecessary MQW region by etching, an InGaAsP layer 509 into which Ru was doped was formed by butt-joint regrowth. After the mask was removed, a necessary portion was covered again with a mask and a diffraction grating 508 was formed. After removing the mask, a p-InP cladding layer 505 and a contact layer 506 were grown on entire region, and the crystal growth process was ended. Next, a necessary portion was protected with a mask and a slant reflector 510 was formed by wet etching. Then, amesa was formed by using a mesa mask on a stripe. Furthermore, a back-surface lens 511 was formed by etching after polishing the substrate. After that, a passivation film is formed by using an ordinary manufacturing method, planarization is performed by using polyimide, and upper and lower electrodes 507 and 501 were formed to complete the laser. After cleavage, the HR coat 503 was applied to one cleavage end side of the manufactured laser.

The 200 μm long laser having a MQW active layer part of 75 μm length was operated with 10 mA current drive at 10 GHz at 100° C. The laser beam was reflected by the slant reflector and was focused by the back-surface lens, and emitted from the back-surface side. The laser characteristics did not deteriorate even during the long term operation, showing the high reliability. Moreover, the manufacturing yield of the laser was also high.

EXAMPLE 2

Example 2 is a case of using the stacked structure of an Ru-doping layer and an Fe-doping layer for suppressing a leak current in a window region. The element is of a DFB type. Although the MOVPE method was used here, growth methods are not limited to it. Other techniques may be used as long as similar effects are obtainable. In addition to the case of Example 1, ferrocene was used as dopant of Fe for the materials used.

Figure 6A:
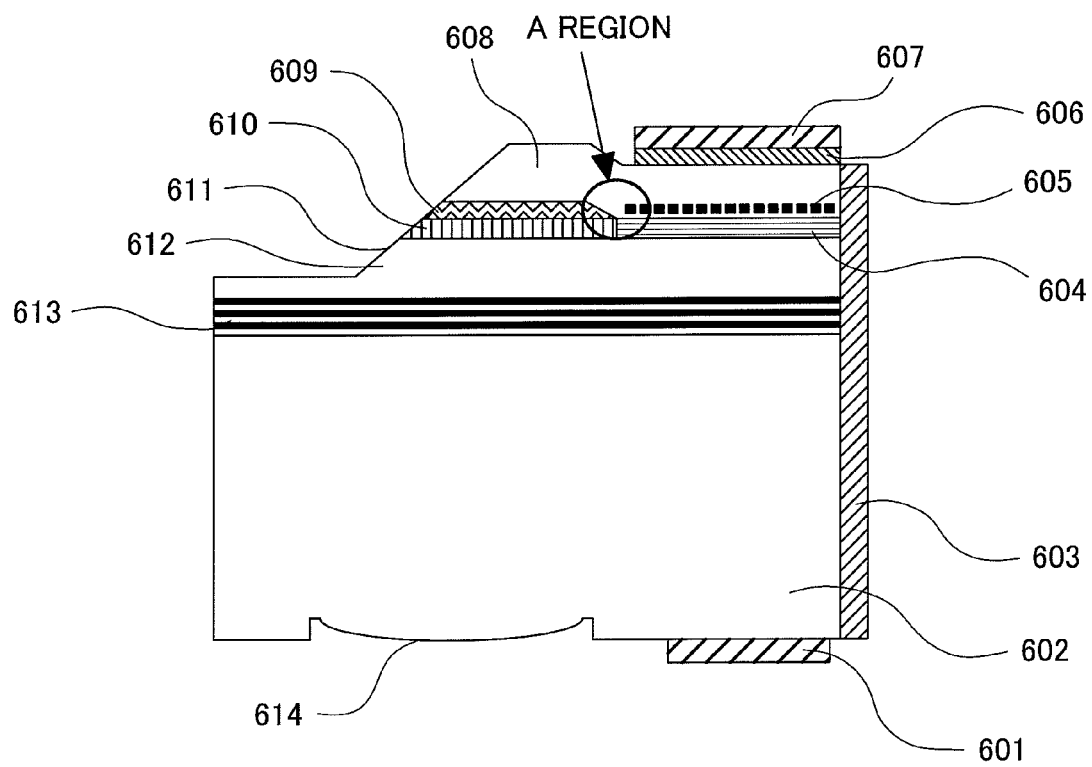
FIG. 6A shows a cross-sectional view of the InGaAlAs short cavity laser of the present invention.

FIG. 6A is a cross-sectional view of the laser. First, the multilayer reflecting mirror 613 composed of n-InGaAlAs/InP was formed on the n-InP substrate 602. After forming the n-InP buffer layer 612, the laser part MQW active layer 604 made of InGaAlAs was grown. Then, a mask of a desired shape was formed. After removing an unnecessary MQW region by etching, the Ru-doped InP layer 610 and Fe-doped InP layer 609 were formed by butt-joint regrowth. After removing the mask, a necessary portion was covered again with a mask and the diffraction grating 605 was formed. After removing the mask, the p-InP cladding layer 608 and contact layer 606 were grown on entire region, and the crystal growth process was ended. Next, a necessary portion was protected with a mask and the slant reflector 611 was formed by dry etching. Then, amesa was formed by using a mesa mask on a stripe. Furthermore, the back-surface lens 614 was formed by etching after polishing the substrate. Then, according to an ordinary manufacturing method, a passivation film was formed, planarization was performed by using polyimide, and upper and lower electrodes 607 and 601 were formed to complete the element. After cleavage, the HR coat 603 was applied to the back surface of the manufactured laser.

Figure 6B:
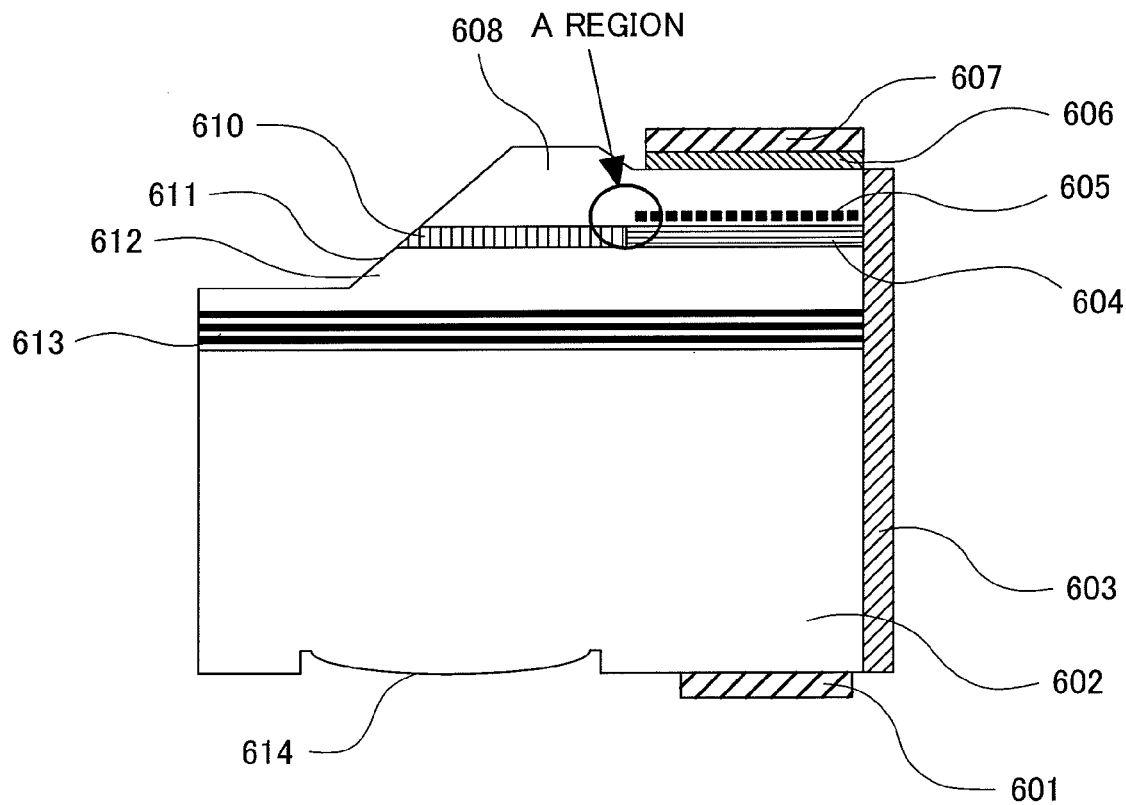
FIG. 6B shows a cross-sectional view of the InGaAlAs short cavity laser of the present invention.

The 200 μm long laser having a MQW active layer part of 50 μm length was operated with 7 mA current drive at 10 GHz at 100° C. The laser beam was reflected off the slant reflector, and was focused by the back-surface lens, and emitted from the back-surface side. The laser characteristics did not deteriorate even during long term operation, showing high reliability. Also, the manufacturing yield of the laser was high. As described in Example 1, even if the Ru-doping layer alone is used, it is possible to obtain the effects of the present invention. In that case, the structure will be as shown in FIG. 6B.

EXAMPLE 3

Example 3 is, like Example 2, a case where the Ru-doping layer alone was used to suppress a leak current in the window region. The element was of a DBR type. In this case, GaAs was used for the substrate and GaInNAs was used for the active layer. As growth methods, a solid source MBE method was used for an active layer portion and the MOVPE method, which is advantageous in re-growth, was used for the window region and the p-InP cladding layer. Metal aluminum, metal gallium, and metal indium were used for materials of group-III elements in the solid source molecular-beam MBE method. Moreover, as source materials of group-V elements, nitrogen activated by RF plasma and metal arsenic were used. Moreover, Si was used as n-type dopant and Be was used as p-type dopant. As for materials used in the MOVPE method, they are substantially the same as those already described in Examples 1 and 2.

Figure 7:
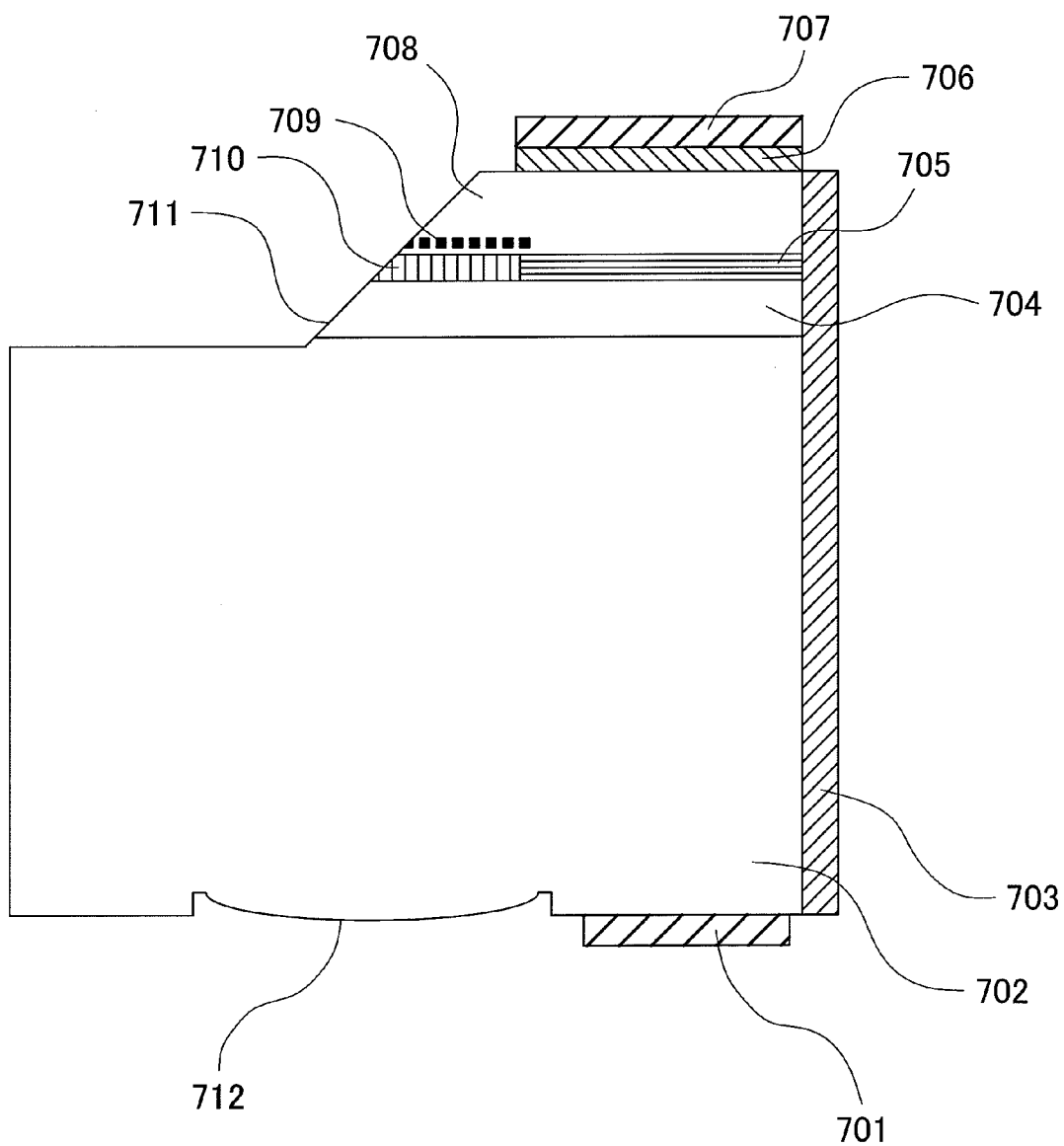
FIG. 7 shows a cross-sectional view of a GaInNAs short cavity laser of the present invention.

FIG. 7 is a cross-sectional view of an laser. First, on an n-GaAs substrates 702, an n-GaInP cladding layer 704 and a laser part MOW active layer 705 made of GaInNAs/GaAs were successively grown by the MBE method. Next, a mask of a desired shape is formed. After removing an unnecessary MQW region by etching, an Ru-doped GaAs layer 710 was formed by butt-joint regrowth. After removing the mask, a necessary portion was covered again with a mask and a diffraction grating 709 was formed on an Ru-doped GaAs layer. After removing the mask, a p-GaInP cladding layer 708 and a contact layer 706 were grown on entire region, and the crystal growth process was ended. Next, a required portion was protected with a mask and a slant reflector 711 was formed by dry etching. Then, amesa was formed on a stripe by using a mesa mask. Furthermore, a back-surface lens 712 was formed by etching after polishing the substrate. After that, by using an ordinary manufacturing method, a passivation film was formed, planarization was performed by using polyimide, and upper and lower electrodes 707 and 701 were formed to complete the laser. After cleavage, an HR coat film 703 was applied to the back surface of the manufactured laser.

The 200 μm long laser having a MQW active layer part of 100 μm length was operated with 12 mA current drive at 10 GHz at 100° C. The laser beam was reflected off the slant reflector, and was focused by the back-surface lens, and emitted from the back-surface side. The laser characteristics did not deteriorate even during the long term operation, showing high reliability, and the manufacturing yield of the laser was also high.

EXAMPLE 4

Figure 8:
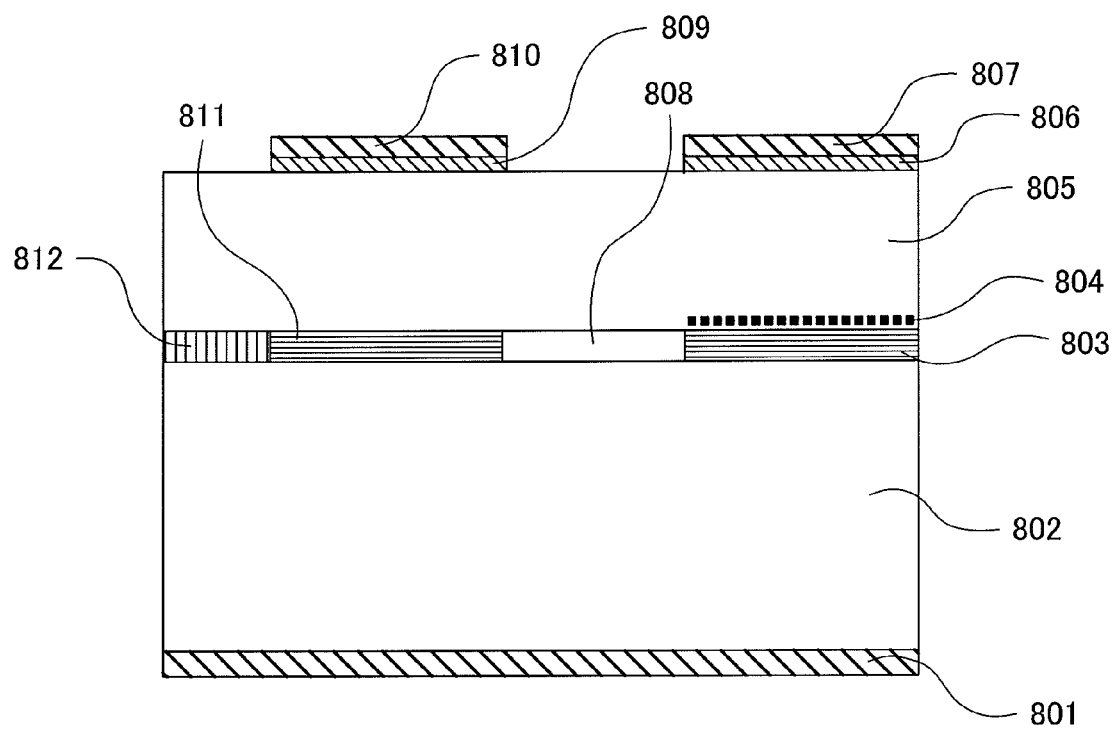
FIG. 8 shows a cross-sectional view of an electro-absorption modulator integrated DFB laser of the present invention.

Example 4 is a case where the present invention is applied to an electro-absorption modulator integrated DFB laser. Although the MOVPE method was also used here, growth methods are not limited to it, and other techniques can be used. The materials used were the same as those in Examples 1 and 2. FIG. 8 is a cross-sectional view of an element. First, a MQW active layer 803 of the laser part made of InGaAlAs was grown on an n-InP substrate 802. Next, a mask of a desired shape was formed, and an unnecessary MQW active layer 803 was removed by etching. Then, a MQW absorption layer 811 of an electro-absorption modulator part made of InGaAlAs was formed by butt-joint regrowth. After removing the mask, a necessary portion was covered again with a mask, and an InGaAsP-waveguide layer 808 was formed by butt-joint regrowth. After removing the mask, a necessary portion was covered with a mask again, and an InP layer 812 into which Ru was doped was formed by butt-joint regrowth. After removing the mask, a necessary portion was covered with a mask, and a diffraction grating 804 was formed over the MQW active layer 803 of the laser part. After removing the mask, a p-InP cladding layer 805 and contact layers 806 and 809 were grown all over the surface of the laser, and the crystal growth process was ended. After that, by using an ordinary element manufacturing method, a passivation film was formed, planarization was performed by using polyimide, a part of contact layer was removed to separate the modulator portion and laser portion electrically, and upper electrodes 807 and 810 above the laser part and modulator part and a lower electrode 801 were formed to complete the laser. After cleavage, the HR coating (not shown) was applied on one cleaved facet of the manufactured laser. The manufactured laser was operated at a temperature within a range of from −5° C. to 85° C. at 10 GHz without a cooler. The laser characteristics did not deteriorate even during the long term operation, showing high reliability, and the manufacturing yield of the laser was also high.

Reference numerals used in the drawings of the application is described below.

| | |
|---|---|
| 101 | lower electrode, |
| 102 | n-InP substrate, |
| 103 | HR coating film, |
| 104 | active layer, |
| 105 | p-InP cladding layer, |
| 106 | contact layer, |
| 107 | upper electrode, |
| 108 | diffraction grating, |
| 109 | InGaAsP layer, |
| 110 | slant reflector, |
| 111 | back-surface lens, |
| 201 | lower electrode, |
| 202 | n-InP substrate, |
| 203 | HR coating film, |
| 204 | active layer, |
| 205 | p-InP cladding layer, |
| 206 | contact layer, |
| 207 | upper electrode, |
| 208 | diffraction grating, |
| 209 | InGaAsP layer, |
| 210 | slant reflectors, |
| 211 | back-surface lens, |
| 301 | n-InP substrate, |
| 302 | active layer, |
| 303 | p-InP cladding layer, |
| 304 | contact layer, |
| 305 | diffraction grating, |
| 306 | InGaAsP layer, |
| 307 | slant reflector, |
| 308 | back-surface lens, |
| 309 | n-type InP substrate, |
| 310 | active layer, |
| 311 | p-InP cladding layer, |
| 312 | contact layer, |
| 313 | diffraction grating, |
| 314 | InGaAsP layer, |
| 315 | slant reflector, |
| 316 | semi-insulating InP buried layer, |
| 317 | back-surface lens, |
| 501 | lower electrode, |
| 502 | n-InP substrate, |
| 503 | HR coating film, |
| 504 | active layer, |
| 505 | p-InP cladding layer, |
| 506 | contact layer, |
| 507 | upper electrode, |
| 508 | diffraction grating, |
| 509 | Ru-doped InGaAsP layer, |
| 510 | slant reflector, |
| 511 | back-surface lens, |
| 601 | lower electrode, |
| 602 | n-InP substrate, |
| 603 | HR coating film, |
| 604 | active layer, |
| 605 | diffraction grating, |
| 606 | contact layer, |
| 607 | upper electrode, |
| 608 | p-InP cladding layer, |
| 609 | Fe-doped InP layer |
| 610 | Ru-doped InP layer, |
| 611 | slant reflector, |
| 612 | n-InP buffer layer, |
| 613 | multilayer reflecting mirror, |
| 614 | back-surface lens, |
| 701 | lower electrode, |
| 702 | n-GaAs substrate, |
| 703 | HR coating film, |
| 704 | an n-GaInP cladding layer, |
| 705 | laser part MOW active layer, |
| 706 | contact layer, |
| 707 | upper electrode, |
| 708 | p-GaInP cladding layer, |
| 709 | diffraction grating, |
| 710 | Ru-doped GaAs layer, |
| 711 | slant reflector, |
| 712 | back-surface lens, |
| 801 | lower electrode, |
| 802 | an n-InP substrate, |
| 803 | active layer of laser, |
| 804 | diffraction grating, |
| 805 | p-InP cladding layer, |
| 806 | contact layer of the laser part, |
| 807 | upper electrodes above the laser part, |
| 808 | waveguide layer, |
| 809 | contact layer of the modulator part, |
| 810 | upper electrodes above the modulator part, |
| 811 | absorption layer of modulator, |
| 812 | Ru-doped InP layer |

What is claimed is:

1. A semiconductor laser device, comprising:
a first region and a second region, wherein the first region includes an active layer provided on a semiconductor substrate, said active layer being configured for generating a laser beam;
an upper cladding layer provided above the active layer; and
a mesa structure, comprised of a semiconductor material provided above the active layer,
wherein the second region comprises a window region at an edge of the semiconductor laser device from which the laser beam is emitted;
wherein a semiconductor layer of the window region has a band gap larger than that of the energy of the laser beam;
wherein the semiconductor layer of the window region comprises a stacked structure of an n-type semiconductor layer, a first semi-insulating semiconductor layer, and a p-type semiconductor layer; and
wherein a first semi-insulating semiconductor into which a material selected from the group of Ru, Os, Rh, and Ti is doped is used for part of or whole of the semi-insulating semiconductor layer.

2. The semiconductor laser according to claim 1, wherein the semiconductor material for composing the semiconductor laser is selected from combinations of materials of the group of In, Ga, Al, B, TI, Bi, As, P, Sb, and N.

3. The semiconductor laser according to claim 2, wherein a reflecting mirror is provided at one end of the window region to direct an outgoing direction of the laser beam upward or downward of the substrate.

4. The semiconductor laser according to claim 2, wherein a length of the active layer is within a range of from 10 μm to 100 μm.

5. The semiconductor laser according to claim 3, wherein a lens structure is provided inside the semiconductor substrate to focus a laser beam reflected off the reflecting mirror.

6. The semiconductor laser according to claim 5, wherein a length of the active layer is within a range of from 10 μm to 100 μm.

7. The semiconductor laser according to claim 2,
wherein a reflecting mirror is provided at one end of the window region to direct an outgoing direction of the laser beam upward or downward of the substrate; and
wherein a length of the active layer is within a range of from 10 μm to 100 μm.

8. The semiconductor laser according to claim 1,
wherein the semi-insulating semiconductor layer is a stacked structure of a layer into which a material selected from the group of Ru, Os, Rh, and Ti is doped and a layer into which Fe is doped; and
wherein the layer into which Fe is doped is stacked continuously with a p-type semiconductor layer into which Zn is doped.

9. The semiconductor laser according to claim 8, wherein the semiconductor material for composing the semiconductor laser is selected from combinations of materials of the group of In, Ga, Al, B, TI, Bi, As, P, Sb, and N.

10. The semiconductor laser according to claim 9, wherein a reflecting mirror is provided at one end of the window region to direct an outgoing direction of the laser beam upward or downward of the substrate.

11. The semiconductor laser according to claim 9, wherein a length of the active layer is within a range of from 10 μm to 100 μm.

12. The semiconductor laser according to claim 10, wherein a lens structure is provided inside the semiconductor substrate to focus a laser beam reflected off the reflecting mirror.

13. The semiconductor laser according to claim 12, wherein a length of the active layer is within a range of from 10 μm to 100 μm.

14. The semiconductor laser according to claim 9,
wherein a reflecting mirror is provided at one end of the window region to direct an outgoing direction of the laser beam upward or downward of the substrate; and
wherein a length of the active layer is within a range of from 10 μm to 100 μm.

15. The semiconductor laser according to claim 1,
wherein a diffraction grating is provided in the first region or the second region.

16. The semiconductor laser according to claim 15,
wherein a semiconductor material for forming the semiconductor laser is selected from combinations of materials of the group of In, Ga, Al, B, TI, Bi, As, P, Sb, and N.

17. The semiconductor laser according to claim 1,
wherein a diffraction grating is provided in the first region;
wherein a third region comprising an electro-absorption modulation is provided between the first region and the second region; and
wherein the semiconductor layer in the window region has a band gap larger than that of the energy of the laser beam.

18. The semiconductor laser according to claim 1,
wherein a diffraction grating is provided in the first region,
wherein the semiconductor layer of the window region further comprises, in the stacked structure, a first semi-insulating semiconductor layer, a second semi-insulating semiconductor layer located between the first semi-insulated semiconductor layer and the p-type semiconductor layer; and
where Fe is doped into the second insulating layer;
wherein Zn is doped into the p-type semiconductor layer.

* * * * *